United States Patent [19]

Mohebban

[11] Patent Number: 4,818,072
[45] Date of Patent: Apr. 4, 1989

[54] METHOD FOR REMOTELY DETECTING AN ELECTRIC FIELD USING A LIQUID CRYSTAL DEVICE

[75] Inventor: Manoochehr Mohebban, Foster City, Calif.

[73] Assignee: Raychem Corporation, Menlo Park, Calif.

[21] Appl. No.: 193,005

[22] PCT Filed: Jul. 22, 1987

[86] PCT No.: PCT/US87/01758
§ 371 Date: Mar. 18, 1988
§ 102(e) Date: Mar. 18, 1988

[87] PCT Pub. No.: WO88/00718
PCT Pub. Date: Jan. 28, 1988

Related U.S. Application Data

[63] Continuation-in-part of Ser. No. 888,892, Jul. 22, 1986.

[51] Int. Cl.[4] .............................................. G02F 1/13
[52] U.S. Cl. ................................. 350/336; 350/331 R; 350/334
[58] Field of Search .................... 350/331 R, 336, 334

[56] References Cited

U.S. PATENT DOCUMENTS

| 3,627,408 | 12/1971 | Fergason | 350/331 R |
|---|---|---|---|
| 3,667,039 | 5/1972 | Garfein et al. | |
| 4,105,297 | 8/1978 | Shimizu | 350/336 |
| 4,140,371 | 2/1979 | Kanazaki et al. | 350/336 |
| 4,242,635 | 12/1980 | Burns | 350/331 R X |
| 4,286,210 | 8/1981 | Ignatjev | 350/331 R X |
| 4,479,118 | 10/1984 | Cole, Jr. | |
| 4,591,233 | 5/1986 | Fergason | |
| 4,641,923 | 2/1987 | Bohmer et al. | 350/336 X |
| 4,772,099 | 9/1988 | Kato et al. | 350/336 X |

FOREIGN PATENT DOCUMENTS

| 2949561 | 6/1981 | Fed. Rep. of Germany |
| 3308972 | 9/1983 | Fed. Rep. of Germany |
| 3219703 | 12/1983 | Fed. Rep. of Germany |
| 3403655 | 8/1985 | Fed. Rep. of Germany |

Primary Examiner—Stanley D. Miller
Assistant Examiner—Richard Gallivan
Attorney, Agent, or Firm—Yuan Chao; Edith A. Rice; Herbert G. Burkard

[57] ABSTRACT

A method for detecting an electric field surrounding an electrical component with a device having a liquid crystal display element, the device being positioned at a distance from the component and being unconnected ohmically to either the component or ground.

35 Claims, 5 Drawing Sheets

U.S. Patent    Apr. 4, 1989    Sheet 1 of 5    4,818,072
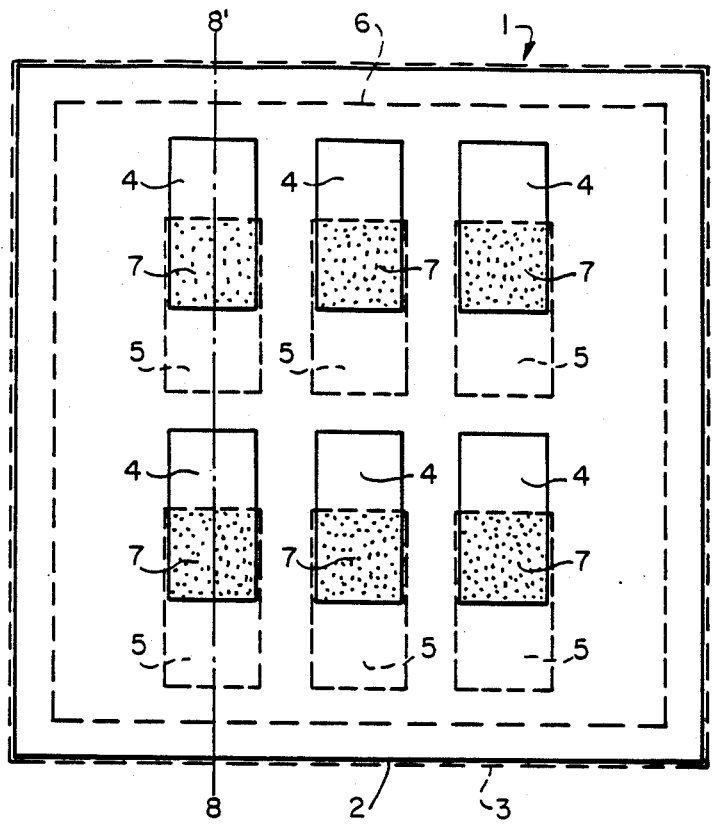
FIG_1
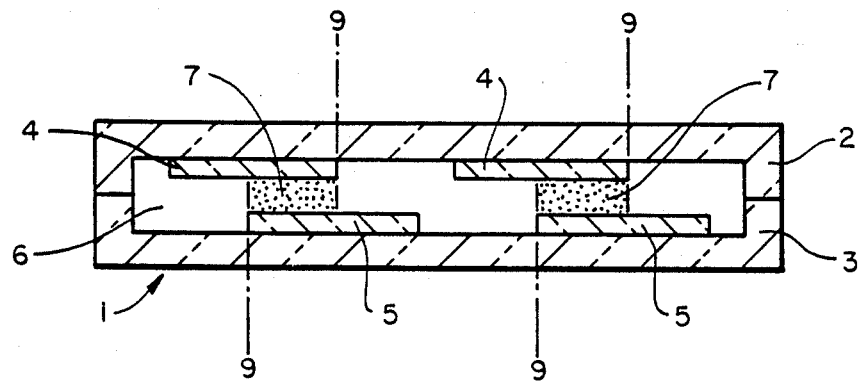
FIG_2

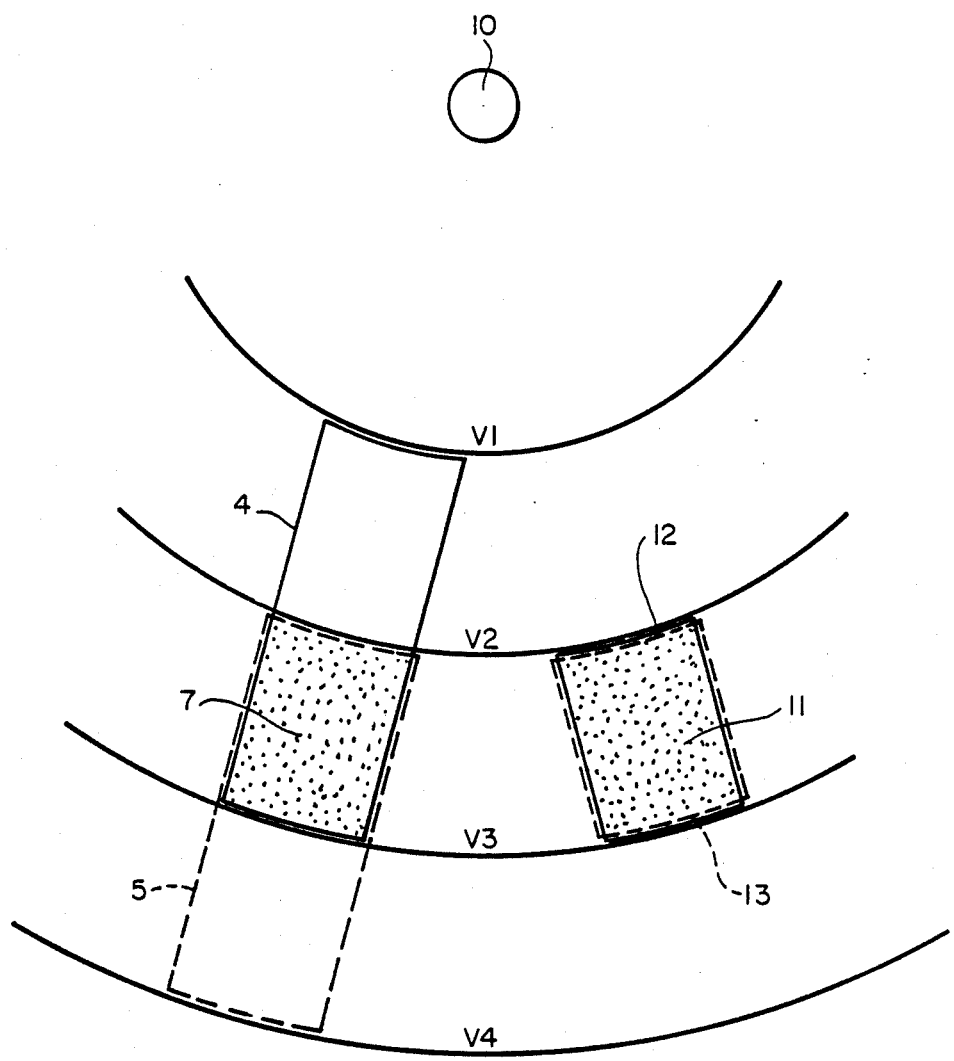
FIG_3

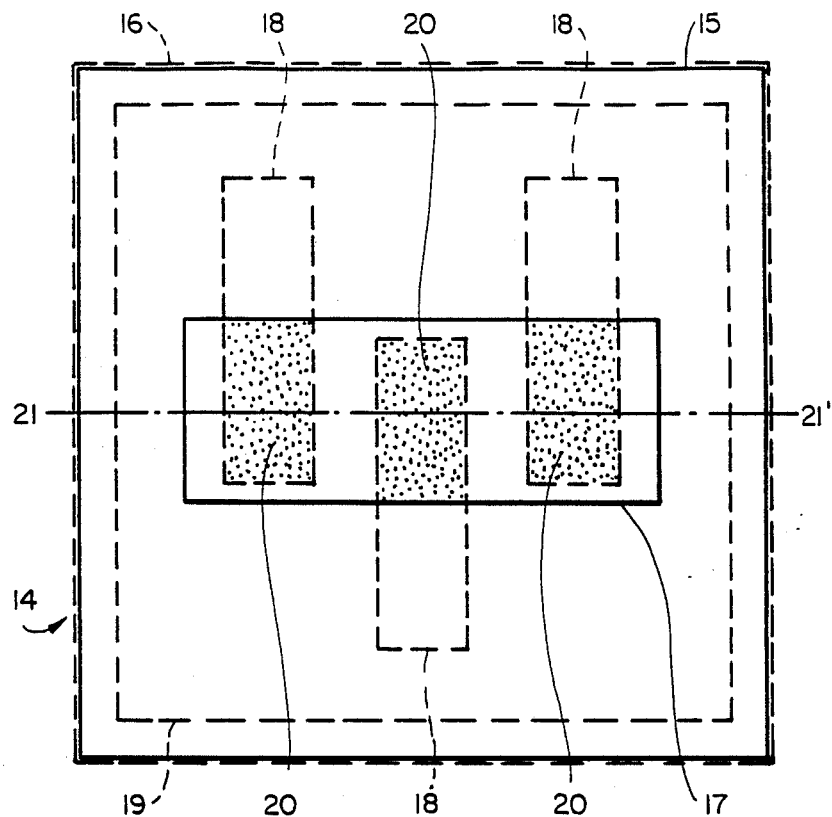
FIG_4
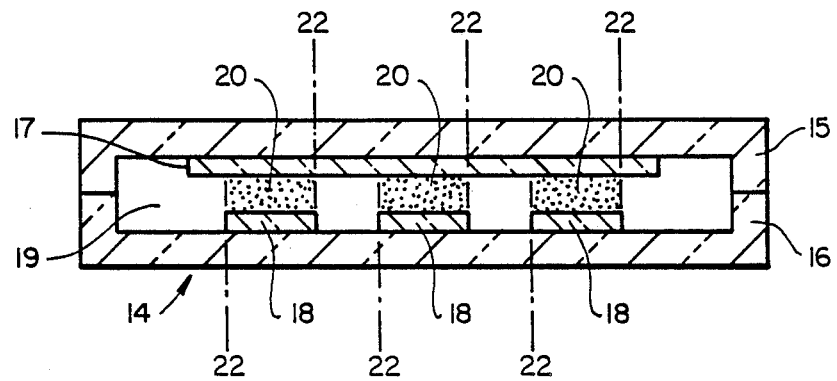
FIG_5

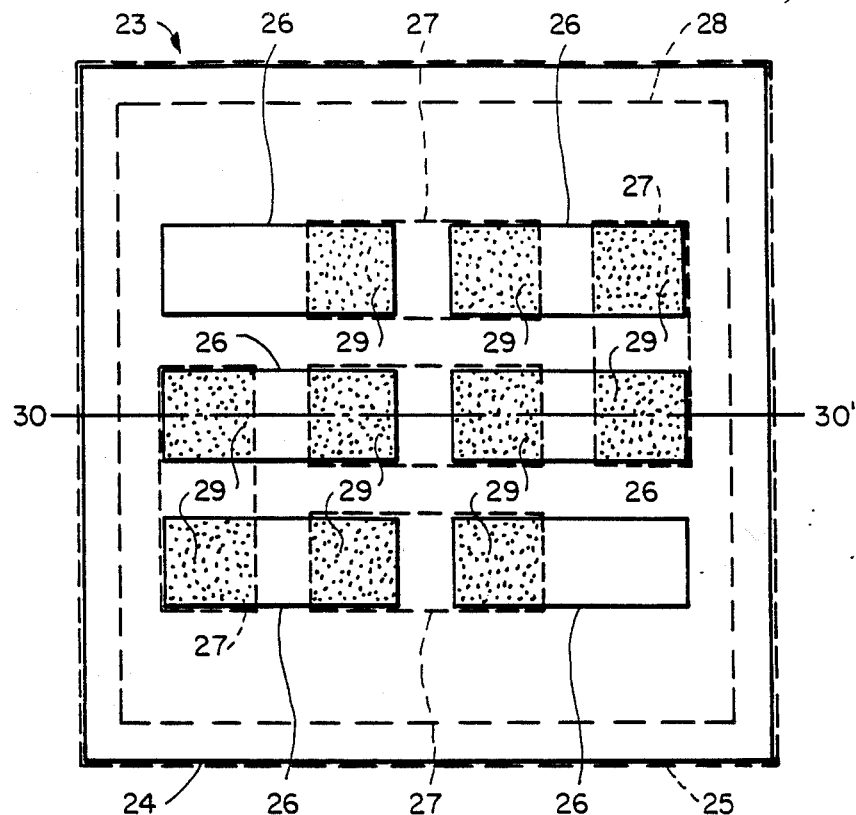
FIG_6
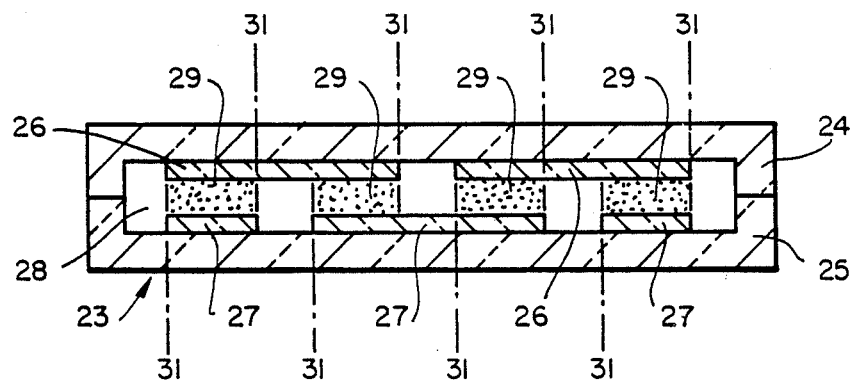
FIG_7

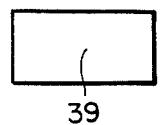
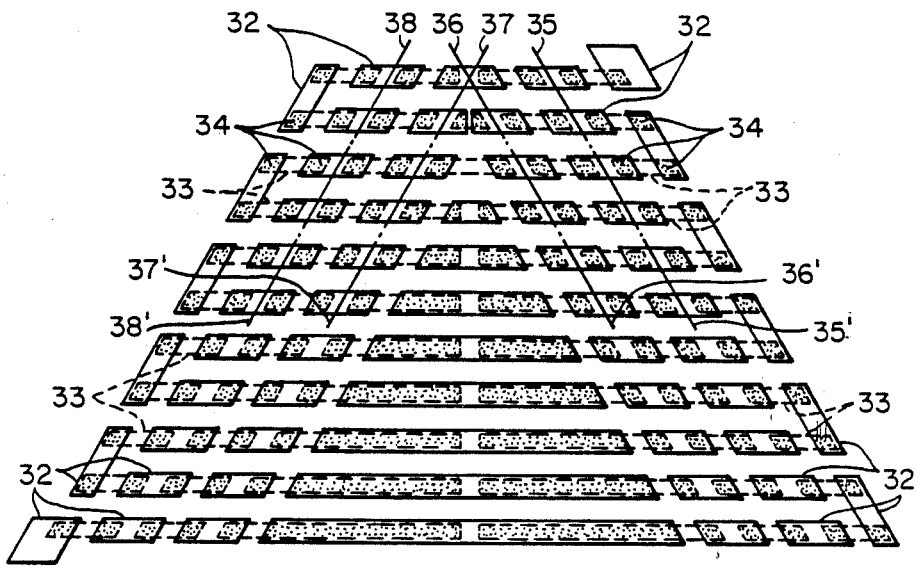
FIG_8
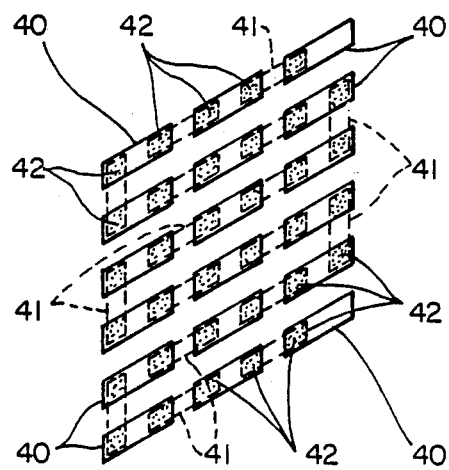
FIG_9

METHOD FOR REMOTELY DETECTING AN ELECTRIC FIELD USING A LIQUID CRYSTAL DEVICE

This application is a continuation-in-part of Ser. No. 888,892, filed July 22, 1986.

This invention relates to a method of detecting an electric field, particularly a method using a device having a liquid crystal display element, and to a device for detecting an electric field, particularly a device having a liquid crystal display element.

BACKGROUND OF THE INVENTION

It is frequently necessary to determine whether a particular component, line, cable, element, etc., in an electrical circuit is "live," that is, whether it bears a voltage. Such a determination is especially important where the voltage of concern is substantial, for obvious safety reasons. Even where electrical circuits proper are not involved, the ability to detect a voltage may be important. To cite but a few examples: because of the fire hazard represented by sparks, it is often desirable to know if there is an accumulation of static electricity in an object. A piece of equipment associated with an electrical circuit but not part of the circuit itself may need to be tested to determine if it has been properly grounded of if it has been unintentionally electrically connected to the circuit. A capacitor may need to be tested to determine if it is charged. Hereinafter, the generic term "electrical component" will be used to designate not only components, lines, cables, etc. in an electrical circuit proper, but also articles and equipment in which a static or other electrical charge is to be detected.

Preferably, the device for such determinations is rugged, portable, easy to use, reliable, and inexpensive. Ruggedness permits the device to survive adverse use conditions in which it might be subjected to impact, temperature extremes, chemicals, etc. Portability is advantageous because a portable device can monitor a multiplicity of components instead of being permanently or semi-permanently attached to a particular one. For example, where a single electrical system requires non-simultaneous voltage monitoring at several different points, this can be done with a single portable device. An easy-to-use device does not require complex physical or electrical connections to the component being monitored. Preferably, the connections are simple to make and disconnect; more preferably, the device operates remotely—that is, it requires no connections whatsoever. A remote device is also advantageous safety-wise, since the danger of an electric shock in the event of a malfunction or misuse is reduced. The device should be reliable, for a false negative reading can create a severe risk of injury. The economic advantages of an inexpensive device are self-evident. For example, where it is desirable to monitor several points in an electrical system simultaneously, an inexpensive device reduces or minimizes the cost of installing one such device at each point.

Further, while for certain applications the device need only display a qualitative, "on" or "off" indication of voltage, for other applications it is desirable or essential that the device provide a quantitative or semi-quantitative read-out of the voltage being detected.

Liquid crystals have been employed in the display element of many devices, including voltage detecting devices. Such devices rely on the preferential alignment of the long axes of the constituent molecules along one direction, a phenomenon known as molecular anisotropy, and the ability to control this preferential alignment with an applied voltage. The optical properties of such liquid crystals are also anisotropic. For example, along one axis, light may be scattered or absorbed, giving the liquid crystal material an opaque or dark appearance, while along a perpendicular axis, light may be transmitted, giving the liquid crystal material a transparent appearance.

Liquid crystal displays (LCD's) possess numerous advantages which are reflected by their popularity and ascendancy over other types of displays, such as light emitting diodes, or LED's. LCD's are easily fabricated into complex patterns which can be in the form of alphanumeric characters or graphic symbols. A single LCD display can comprise multiple elements which can be simultaneously or independently addressed, so that a single display panel can convey different messages. Witness, for example, the familiar seven bar display of LCD watches and calculators. LCD's consume very little electrical power, and the threshold voltage needed to switch from one state to the other is relatively low.

A number of LCD devices for detecting a voltage are known. But each has one or more disadvantages limiting its utility.

U.S. Pat. No. 3,627,408 (Fergason) discloses a device for detecting an unknown electric field, comprising a layer of cholesteric liquid crystalline material and a first and a second electrical conductive members for impressing an electric field across the layer. A voltage source is electrically connected to the first and second conductive members.

DE No. 2,949,561-A1 (Walter) discloses an analog voltage display in which the active display area comprises a number of individual LCD elements formed from the overlap of each electrode with two opposing electrodes. The extent of overlap is varied so that a series of LCD units of increasing size is formed. The display is electrically connected across the voltage source being estimated.

DE No. 3,219,703-A1 (Kehr) discloses an electrical connector for medium and high voltage cables in which an LCD monitor on the connector gives a continuous read out of on/off state of the cable. The monitor is coupled via a voltage reduction circuit to the current carrying parts of the cable. The monitor is connected to the shield of the cable, which is grounded.

DE No. 3,308,972-A1 (Heverhagen et al.) discloses a device for displaying the operating state of a fuse. An LCD with a series-connected capacitor is electrically connected across the fuse being monitored. Both connecting leads may be ohmically connected, or one may be capacitively coupled while the other is ohmically connected.

DE No. 3,402,655-A1 (Goehlich) discloses a device for indicating the state of a high voltage installation. This device, which has an LCD display, is electrically connected to the installation by a single-pole connecting line and is capacitively coupled to ground.

Each of these prior art devices is limited in that at least one of the device leads must be ohmically connected to the electrical component being tested or to ground. Some of the devices, such as those of Fergason, Heverhagen, Kehr, and Goehlich, can provide an "on/off" reading, but not a quantitative estimation of voltage. These prior art devices, because of the requirement for ohmic contact with the electrical component or ground, are unsuitable for detecting a buildup of static electricity, which is readily discharged upon contact with the device.

SUMMARY OF THE INVENTION

I have invented a method of and a device for detecting a voltage which does not require any ohmic connection of the device to either the component being tested or to ground. A device of my invention operates by sensing and responding to the electric field surrounding the electrical component. That is, it operates "at a distance." Thus, my invention suitable for determining if an electrical component carries a static electrical charge. In another embodiment of my invention, a voltage is detected and its magnitude is quantitatively estimated. Further, my invention is easy to use, reliable, and safe.

This invention provides a method of detecting an electric field generated by an electrical component, comprising the steps of:

(I) providing a device having at least one liquid crystal display element, the display element comprising:
  (a) a first conductor, at least part of which is transparent;
  (b) a second conductor aligned relative to the first conductor such that a portion of one of the conductors extends significantly beyond the other; and
  (c) a liquid crystal material optically responsive to an electric field and positioned between the first and second conductors;

(II) bringing the device into the proximity of the electrical component, but without making electrical contact with either the component or with ground, such that the first and second conductors are positioned at different areas of intensity of the electric field; and (III) observing the optical state of the liquid crystal display element.

Preferably, the device comprises an array comprising a plurality of liquid crystal display elements, which can be electrically insulated from each other or can be electrically connected in series. The liquid crystal display elements can have substantially the same or different capacitances.

This invention also provides a device for detecting an electric field surrounding an electrical component, the device comprising:

(I) an array comprising a plurality of liquid crystal display elements each of which comprises
  (a) a first conductor, at least part of which is transparent;
  (b) a second conductor aligned relative to the first conductor such that a portion of one of them extends significantly beyond the other; and
  (c) a liquid crystal material optically responsive to an electric field and positioned between the first and second conductors; and (II) a protective packaging surrounding and electrically insulating the array from the exterior environment, the protective packaging being at least partially transparent to permit viewing of the optical state of at least one of the liquid crystal display elements.

Preferably, the protective packaging comprises a first and a second transparent sheets of support material sealed to each other at their edges. In yet another preferred embodiment, the device further comprises an insulating means for attaching the device to the component in the region where the electric field is to be detected. In yet another preferred embodiment, the device further comprises an insulating means for positioning the device in the region where the electric field is to be detected.

In yet another embodiment of the invention, there is provided a liquid crystal device for detecting an electric field surrounding an electrical component, the device having a laminar structure comprising a first and a second transparent supporting sheet;

a first and a second transparent conductor, respectively deposited on the inside surfaces of the first and second sheets; and encapsulated liquid crystal material optically responsive to an electric field, sandwiched between the first and second sheets and in contact with the first and second transparent conductors;

the first and second transparent conductors being aligned such that the first conductor partially overlaps the second conductor, and vice-versa; and the first and second sheets being sealed to each other along the edges thereof, to form a protective package sealing off and electrically insulating the conductors and the liquid crystal material from the exterior environment.

In yet another preferred embodiment, this invention provides a method of estimating the magnitude of the potential of an electrical component from the intensity of the electric field generated by the component, comprising the steps of:

(I) providing a device having an array of liquid crystal display elements, each of the display elements comprising:
  (a) a first conductor, at least part of which is transparent;
  (b) a second conductor aligned relative to the first conductor such that a portion of one of the first and second conductors extends significantly beyond the other conductor; and
  (c) a liquid crystal material optically responsive to an electric field and positioned between the first and second conductors;

the device having been calibrated as to which liquid crystal display elements change their optical state at a specified distance from a potential source with a known potential;

(II) bringing the device to the specified distance in the proximity of the electrical component, but without making electrical contact with either the component or with ground;

(III) observing which liquid crystal display elements have changed their state; and (IV) estimating the voltage of the component by reference to the calibration.

BRIEF DESCRIPTION OF THE DRAWINGS

FIG. 1 shows a device of this invention comprising an array comprising a plurality of LCD's not in ohmic contact with each other.

FIG. 2 is a cross-sectional view of the device of FIG. 1.

FIG. 3 shows schematically the operation of a device of my invention in the presence of an electric field.

FIG. 4 shows a device of this invention in which a plurality of LCD's share a common electrode. FIG. 5 is a cross-sectional view of the device of FIG. 4.

FIG. 6 shows a device of this invention in which a plurality of LCD's are ohmically connected in series. FIG. 7 is a cross-sectional view of the device of FIG. 6.

FIG. 8 shows another device of this invention in which a plurality of LCD's are ohmically connected in series.

FIG. 9 shows yet another device of this invention in which a plurality of LCD's are ohmically connected in series.

DETAILED DESCRIPTION OF THE PREFERRED EMBODIMENTS

My invention provides a method of and a device for detecting an electric field surrounding an electrical component. The detection occurs remotely or "at a distance," by which I mean that my device is not ohmically connected to either the electrical component being tested or to ground. Furthermore, my invention is adaptable to estimating the intensity of an electric field. Since electric field intensity is relatable to the voltage of the electrical component generating it, this permits an estimation of the voltage of the electrical component. My invention is particularly suitable for the detection of electric fields generated by high voltage components, by which I mean components having voltages between 500 V and 100 kV, preferably between 1 kV and 69 kV.

My invention can readily be understood by reference to the following figures describing specific preferred embodiments thereof. FIG. 1 depicts a device 1 having a laminar construction wherein support materials 2 and 3 form the top and bottom layers of the laminate. Electrical conductors 4 and 5 are deposited on the inner surfaces of support materials 2 and 3, respectively, in the desired pattern. Sandwiched between support materials 2 and 3 and in contact with each of conductors 4 and 5 is liquid crystal material 6. The alignment of the conductors 4 and 5 is such that each conductor 4 partially overlaps a conductor 5, and vice versa, thus creating an array of LCD elements 7. The edges of support materials 2 and 3 are sealed, to form a package protecting and electrically insulating the conductors 4 and 5 and the liquid crystal material 6 from the exterior environment. In this particular embodiment, conductors 4 and 5 and support materials 2 and 3 are transparent, to permit viewing of the liquid crystal material 6.

FIG. 2 is a cross-sectional view of the device of FIG. 1, taken along line 8—8'. Imaginary lines 9 are drawn to facilitate visualization of the approximate boundaries of LCD elements 7.

The liquid crystal material in the LCD elements 7 has electric field dependent optical properties. When a voltage is applied to it—thereby creating an electric field—below a certain threshold voltage, it is in one optical state, hereinafter referred to as State 0, characterized by an optical property such as opacity, transparency, a particular color, light scattering, rotation of the plane of polarization of light to a certain extent and/or in a certain direction, etc. When the applied voltage exceeds the threshold voltage, the resultant electric field is sufficiently strong to cause the liquid crystal material to transition to another optical state, hereinafter referred to as State 1, which is optically distinguishable from State 0. For example, if State 0 is opaque, State 1 can be transparent, and vice versa. Of if State 0 is of a certain color, State 1 can be colorless or of a different color. In other words, when the voltage V across conductors 4 and 5 exceeds the threshold value, the LCD element 7 responds by undergoing a State 0 to State 1 transition which can be readily discernible by an observer.

While not wishing to be bound by any theory, I believe that my invention operates as follows: It is well known that when a difference of electric potential exists between two bodies, an electric field is created in the space between them. For example, an A.C. voltage source connected between an electrical component and ground will create a difference in electrical potential between the two: the A.C. voltage source pumps electrons from component to ground, and, alternately, from ground to the component, such that at any given instant a difference in electrical potential exists between them. This potential varies in magnitude and polarity with time. Correspondingly, an electric field exists in the space between the component and ground, its intensity also varying with time.

Similarly, if an isolated component (whether made of conductive or non-conductive material) is charged to a higher electrical potential than ground (or some other neighboring body), an electric field will exist between it and ground. Thus, a static charge results in a constant (electrostatic) voltage between it and ground.

In either case, the strength of the electric field in the space between the component and ground is dependent on the electric potential—i.e., voltage—between the two. Electric field theory also teaches that the intensity of the electric field diminishes as the distance from the charged component increases. This intensity can be represented by a succession of equipotential surfaces (or, in a two-dimensional representation, equipotential lines), each surrounding the charged component. In an ideal situation, in which the component is a point charge and the field is not distorted by the presence of other charged or conductive bodies, the equipotential surfaces are a succession of concentric spheres surrounding the component, each sphere representing a different electrical potential or voltage. As the radii of the spheres increase, the corresponding potentials decrease.

If a small particle is suspended in space at a point A in the electric field, it is at the electric potential of the equipotential sphere (or line) passing through point A. If a second particle is suspended at a point B in space, it is at the potential of the equipotential sphere (or line) passing through point B. If the two particles are electrically isolated from each other, they have an electric potential between them given by the absolute value of $(V_a - V_b)$ where $V_a$ and $V_b$ are the potentials of the equipotential spheres passing through points A and B, respectively. If, however, the two particles are connected by an electrically conductive material, current flows between A and B until the particles are at a common potential $V_c$, a value somewhere between $V_a$ and $V_b$. $V_c$ is approximated by the average between $V_a$ and $V_b$:

$$V_c = \tfrac{1}{2}[V_a + V_b] \quad (1)$$

It therefore follows that a conductive object suspended in an electric field will be at an electrical potential determined by the position of its extremities in the field.

FIG. 3 illustrates schematically how my invention applies these principles for the detection of an electric field. Consider a single LCD element 7 of the type depicted in FIGS. 1 and 2, located some distance from electrical component 10. (For convenience, support materials 2 and 3, the rest of liquid crystal material 6, and the other LCD elements 7 have been omitted.) Component 10, if it carries a voltage, generates an electric field, represented two-dimensionally by equipotential lines $V_1$, $V_2$, $V_3$, and $V_4$, in decreasing order of potential. One extremity of conductor 4 is subject to voltage V1, and the other is subject to voltage V3. But since conductor 4 is electrically conductive, overall it must be at a common, intermediate potential. This potential is approximated by $(V_1+V_3)/2$. Similarly, the potential of conductor 5 is approximated by $(V_2+V_4)/2$. Thus, the total potential—or voltage—Vt across the LCD element 7 given by equation (2):

$$V_t = \tfrac{1}{2}[(V_1+V_3)-(V_2+V_4)] \quad (2)$$

If $V_t$ exceeds the threshold voltage, the liquid crystal material 6 goes from State 0 to State 1, indicating the presence of an electric field, and, consequently, a voltage in component 10. In other words, $V_t$—and whether the LCD element transitions from one state to the other—depends on its location in the electric field. Generally, the closer the device is to the component, the higher the $V_t$.

FIG. 3 also shows, for comparison, LCD element 11, having the same liquid crystal material 6 as a dielectric, but whose conductors 12 and 13 are coincident. In LCD 11, the voltage at both conductors 12 and 13 is given by $(V_2+V_3)/2$, so that there is no net potential across the liquid crystal material. As a result, it does not respond to the electric field generated by component 10.

To practice my invention, a device such as that depicted in FIG. 1 is brought to the proximity of the electrical component being tested, but without making electrical contact with either the component or ground. By proximity, I mean a distance from the component such that the electric field generated by it is sufficiently intense to impart a voltage across the conductors of at least one LCD element in excess of its threshold voltage. If the component carries a voltage, then at least one of the LCD elements will switch from State 0 to State 1. Thus, by simply observing the LCD elements, the user can tell whether an electric field is present, and therefore, whether the component carries a voltage. Not all the LCD elements will necessarily switch at the same time, because, despite being part of the same device, each pair of conductors will occupy somewhat different positions in the electric field, resulting in different $V_t$'s.

The intensity of the electric field generated by an electrical component, and hence, the voltage it carries, can readily be estimated by using an empirical calibration method. A device having multiple LCD elements is located at a fixed or known distance from a component to which known voltages are applied. At each voltage, which LCD elements transition from State 0 to State 1 are tabulated. Later, when the component (or another similar component) is to be tested for an unknown voltage, the device is placed at the same distance. The LCD elements which have transitioned from State 0 to State 1 are noted, and by reference to the previously prepared table, the voltage of the component can be estimated. An alternative, but somewhat less convenient method is to use a device having a single LCD element and moving the device from place to place in order to generate the reference readings.

While my invention can be practiced by hand-holding the device, for some purposes, for example, determining whether a high-voltage cable or other component such as a busbar, capacitor, switch, transformer, elbow, termination, etc., is "live," it might be more convenient or safer to have the device affixed to one end of a long, insulated pole, commonly known as a "hot stick" in the trade, and thereby bringing the device to the proximity of the line. Alternatively, to provide constant monitoring, the device can be physically attached to but electrically insulated from the line or other component, with hooks or other attachment means. Also, in applications in which the component voltage is being estimated, the attachment means can be used as a convenient "yardstick" for affixing the device at a predetermined distance from the component.

The liquid crystal materials which can be used in my invention are numerous. They can be discrete compounds or mixtures. As is well known in the art, liquid crystal materials are often used in blends to extend the temperature range over which they are crystalline, or to achieve other desirable properties not readily achievable with a single compound. They can be of the cyanobiphenyl, benzoate, or Schiff base type, to name a few. They can include a pleochroic dye, to give a colored optical effect. Preferably, the liquid crystal material is nematic or smectic. Suitable nematic liquid crystal materials are found in U.S. Pat. No. 4,591,233, the disclosure of which is herein incorporated by reference.

Because a leakage current can discharge the voltage across the conductors, thus preventing the liquid crystal material from transitioning from State 0 to State 1, it is preferred that the liquid crystal material have a high volume resistivity, by which is meant that the volume resistivity is preferably greater than $1\times 10*(11)$ ohm-cm.

It is also preferred that the liquid crystal material be an encapsulated liquid crystal material. A liquid crystal material is said to be encapsulated when a quantity thereof is confined in a containment or encapsulation medium or material. Encapsulated liquid crystal material can be made by mixing together liquid crystal material and an encapsulating medium in which the liquid crystal material will not dissolve and permitting the formation of discrete capsules containing the liquid crystal material. Preferably, the encapsulating medium has a volume resistivity greater than $1\times 10_{11}$ ohm-cm, for the aforementioned leakage current considerations. A preferred encapsulating medium is poly(vinyl alcohol).

The encapsulated liquid crystal material can be either nematic or smectic. The encapsulation of nematic liquid crystal material is described in U.S. Pat. No. 4,435,047 (Fergason) or U.S. Pat. No. 4,591,233 (Fergason), the disclosures of which are herein incorporated by reference.

The encapsulated liquid crystal material can also be smectic. Encapsulated smectic liquid crystal materials offer an advantage for certain applications, in that they can have "memory," that is, after undergoing a State 0 to State 1 transition, the material remains in State 1 even after the voltage across the conductors is removed. The material can be returned to State 0 by heating. Thus, for applications where it is necessary or desirable to have a semi-permanent indication of the presence of an electric field, encapsulated smectic liquid crystal material is preferred. The encapsulation of smectic liquid crystals is described in U.S. application Ser. No. 740,218 (Fergason), filed June 3, 1985, the disclosure of which is herein incorporated by reference.

As used in this specification, the term "liquid crystal material" includes discrete liquid crystal compounds, blends of liquid crystals, and encapsulated liquid crystals.

In FIG. 1, both conductors are shown as transparent. This is not essential for the practice of my invention. All that is required is that at least the part of a conductor through which the underlying liquid crystal material is to be viewed be transparent. While a composite conductor can be used, that is, a conductor made of a transparent material only in the viewing areas, it is often more convenient to employ a conductor which is transparent throughout. A preferred conductor material is indium tin oxide (ITO). Other suitable materials are gold, nickel, chromium, titanium oxide, tin oxide, aluminum, antimony tin oxide, and indium oxide.

The selection of the support material is not critical. In FIG. 1 both support materials are depicted as transparent. This is not required for the practice of my invention. All that is required is that the support material be transparent at least at those places where the underlying liquid crystal material is to be viewed. As with the conductors, it may be more convenient to employ support material which is transparent throughout. It should also have sufficient mechanical integrity to support and protect the LCD elements and should be a good electrical insulator. It is preferred that the conductor be directly adherent to the support material or be held firmly to it by a suitable adhesive. Suitable support materials include glass and organic polymers, particularly those which are thermoplastic or otherwise conveniently fabricatable into film or sheet form. A preferred support material is poly(ethylene terephthalate), commonly known by the trademark Mylar.

While it is preferred that the support material form a hermetically sealed package for the purpose of protecting and electrically insulating the LCD elements inside, such sealing is not required for the practice of my invention. For example, where the interior materials are not particularly sensitive to environmental moisture or atmospheric oxygen or where long term durability is not critical, the support material need not form a sealed package.

For proper performance, a device of my invention should be constructed so as to distort or interfere with the electric field generated by the electrical component being tested as little as possible. For example, other than the conductors, the device should have no metallic or electrically conductive elements. The size and shape of the conductors and their positioning relative to each other should also take into consideration field distortion effects.

The LCD elements need not be arranged in an ohmically unconnected array, as depicted in FIGS. 1 and 2 and described hereinabove. FIG. 4 depicts in a plan view a device 14 in which a common electrode is shared. The device 14 has top and bottom support materials 15 and 16, on whose respective inside surfaces are deposited a common top electrical conductor 17 and bottom electrical conductors 18. Liquid crystal material 19 is sandwiched between the support materials 15 and 16 and in contact with conductors 17 and 18. Conductor 17 overlaps partially with each of conductors 18, forming LCD elements 20. The edges of support materials 15 and 16 are sealed for protection and insulation. Conductors 15 and 16 and conductors 17 and 18 are shown as transparent in this embodiment.

FIG. 5 is a cross-sectional view of device 14 of Fig. 4, taken along line 21—21'. Imaginary lines 22 are drawn in to facilitate visualization of the approximate boundaries of LCD elements 20.

FIG. 6 shows another embodiment of my invention. The device 23 has top and bottom support materials 24 and 25, respectively. Upper and lower electrical conductors 26 and 27 are deposited onto the inner surface of top and bottom support materials 24 and 25, respectively. Liquid crystal material 28 is sandwiched between the support materials and in contact with the conductors. Each upper conductor 26, except for the first and last ones, overlaps partially with two different lower conductors 27, and vice-versa. In this manner, a sequence of LCD elements 29 electrically connected in series is formed. As before, support materials 24 and 25 are sealed at the edges.

FIG. 7 shows in cross section the same device of FIG. 6, taken along line 30—30'. Imaginary lines 31 are drawn to facilitate visualization of the LCD elements 29.

In the device of FIG. 7, because the individual LCD elements are electrically connected in series, the voltage across each one depends not only on its position in the electric field. Each LCD element is electrically a parallel plate capacitor, in which the overlapping portions of conductors are the plates and the liquid crystal material is the dielectric. The capacitance C of such a capacitor is given by equation (3):

$$C = keA/d \qquad (3)$$

where k is a constant, e is the dielectric constant of the of liquid crystal material, A is the area of overlap of the electrodes, and d is the thickness of the liquid crystal material layer. Also, C is related to the voltage V across the conductors by equation (4):

$$C = q/V \qquad (4)$$

where q is the charge stored in the capacitor.

For n capacitors connected in series, the capacitances and voltages across each individual capacitor are related to the overall capacitance $C_s$ and voltage $V_s$ across by equations (5) and (6):

$$V_s = V_1 + V_2 + \ldots + V_n \qquad (5)$$

$$1/C_s = 1/C_1 + 1/C_2 + \ldots + 1/C_n \qquad (6)$$

where $V_n$ and $C_n$ are the voltage across and capacitance of the nth capacitor.

If the LCD elements have the same capacitance (e.g., have the same dimensions and liquid crystal material), then the voltage across each one is given simply by $$V_1 = V_2 = V_n = V_s/n \qquad (7)$$

If they do not have the same capacitance, the individual voltages can be calculated from equation (8):

$$V_n = V_s C_s / C_n \qquad (8)$$

Thus, where the device has LCD elements connected in series, the overall voltage across the device depends on the positional effects discussed hereinabove with reference to Fig. 3, but the distribution of this voltage across the individual elements follows equation (7) or (8).

In a further embodiment of the invention, the device used may comprise an array comprising a plurality of liquid crystal elements in which a first liquid crystal element has a capacitance in the non-energized state lower than the capacitance of any other of said liquid crystal elements and comprises a liquid crystal material having a positive dielectric anisotropy so that said liquid crystal element has a capacitance in the energized state higher than its capacitance in the non-energized state; and a second liquid crystal element is electrically connected in series with said first liquid crystal element, said second liquid crystal element having a capacitance in the non-energized state lower than the capacitance of the first liquid crystal element in its energized state. Preferably each of the liquid crystal elements comprises a liquid crystal material having a positive dielectric anisotropy. In this embodiment, the liquid crystal elements may be substantially the same size or may be of different sizes. The array of this embodiment is disclosed in commonly assigned PCT application U.S. No. 87/01758 (attorney's docket MP1134A) filed concurrently herewith, the disclosure of which is incorporated herein by reference.

As indicated above, my invention is well suited for the detection of static electricity. By way of illustration, in clean room operations in the semiconductor industry, the detection of the build-up of a static electrical charge is important, and the convenient method of my invention is advantageous. In another application, where natural gas is transmitted through polymeric pipes, the flow of gas through the pipes can create static electricity. My invention provides a service crew with a convenient means for determining if there is any static electricity build-up which could cause a spark and ignite the gas, before entering the pipe to perform maintenance or repairs.

Normally, the detection of static electricity is difficult because the static electricity is discharged by the power consumption requirements of the detection means. However, because my method is a remote one and because my device is high-impedance, low power consumption one, it can readily be used to detect static electricity.

It is to be noted that the size of the LCD units is of some practical consequence. Because a device of my invention operates remotely, it is desirable to minimize its power consumption because the high impedance of air does not permit substantial current flow. One way to accomplish this goal is to reduce its size, but taking into consideration the viewing requirements of the particular application for which it is intended. A person of ordinary skill in the art will readily be able to select the size of LCD best accomodating the need for a low-current but readily viewable device. Another way to reduce the current requirements of the LCD is to use a high-impedance liquid crystal material, as mentioned hereinbefore.

EXAMPLE 1

This example illustrates the preparation of a preferred embodiment of my invention having a laminated construction. In this embodiment the liquid crystal material is "sandwiched" between two layers of support material, each bearing, on the surface facing the liquid crystal material, a pattern of conductors.

A drawing was made of the desired conductor patterns. Using a conventional photoresist technique, each drawing was transferred onto a sheet of transparent support material (Mylar) which had been coated on one side with ITO. The excess and undesirable ITO was removed, leaving on each sheet of support material a pattern of ITO conductors. One of the sheets was then coated on the conductor side with liquid crystal material mixed with encapsulating medium, from Taliq Corp., Mountain View, Ca. The tacky layer of liquid crystal-encapsulating medium mixture was cured. The other sheet was placed over the encapsulated liquid crystal layer, conductor side facing the liquid crystal material and taking care to ensure that the conductor patterns were properly aligned. The sheets were then laminated by heating in an oven, to produce a laminated construction having a plurality of liquid crystal units connected in series.

This particular material is opaque in State 0 and transparent in State 1.

EXAMPLE 2

This example illustrates the use of a device of my invention for the detection and estimation of the magnitude of a voltage.

Referring to FIG. 8, a laminated device having upper electrical conductors 32 overlap with lower electrical conductors 33 to form a series of LCD elements 34 electrically connected in series, in much the same manner as depicted earlier in FIG. 4. (For convenience, the support materials and the rest of the liquid crystal material have been omitted, and not each occurrence of upper and lower conductors 32 and 33 and LCD elements 34 is labeled.) The laminate was prepared according to Example 1. The support material was Mylar and the liquid crystal material was encapsulated according to the method of U.S. Pat. No. 4,435,047, previously incorporated herein by reference. The device was vertically positioned 3 inches below the corona bell of a transformer 39 located 4 feet above the ground. The device was held in place with electrical insulating tape. The transformer voltage at which particular LCD elements changed state (went from opaque to transparent) were noted as below:

| LCD Units Changing State | Transformer Voltage (kV) |
|---|---|
| All the units except the two center units in each of rows 5-11 | 16 |
| All the units except the two center units in each of rows 6-11 | 45 |
| All the units except the two center units in each of rows 7-11 | 60 |
| All the units except the two center units in each of rows 8-11 | 90 |

(Rows counted from top to bottom)

Thus, by reference to which LCD units have changed state, it is possible to determine what the voltage in the transformer is.

EXAMPLE 3

The device of Example 2 was cut along lines 35—35', 36—36', 37—37', and 38—38', as shown in FIG. 8, and the experiment of Example 2 was repeated.

| LCD Unit | Transformer Voltage (kV) |
|---|---|
| Left units of rows 1 and 2; partial turn-on of left units of rows 3 and 4 | 95 |
| Left units of rows 5 and 6 | 102 |
| Some units on right side of | 125 |

| LCD Unit | Transformer Voltage (kV) |
|---|---|
| rows 1–5 | |

This example shows that LCD elements which are not electrically connected can be used for the estimation of the magnitude of the voltage of an electrical component.

EXAMPLE 4

This example illustrates the use of a device of my invention for the detection of static electricity.

A device having, as depicted in FIG. 9, top conductors 40 and bottom conductors 41 overlapping to form LCD elements 42 electrically connected in series was prepared. (For convenience, in FIG. 9 the representations of the support material and the liquid crystal material have been omitted, and not each occurrence of top and bottom conductors 40 and 41 and LCD elements 42 is labelled.) It had a laminar construction with Mylar as the support material, prepared according to Example 1. The liquid crystal material was encapsulated with poly(vinyl alcohol), by the method of U.S. Pat. No. 4,435,047, previously incorporated herein by reference. Each LCD element was approximately 5×5 mm in cross-sectional area, with liquid crystal material between about 10 and 20 microns thick.

A piece of 2¼ inch poly(vinyl chloride) pipe was charged with static electricity by rubbing its surface with a cloth. The voltage at various points along the pipe was measured by a Simco Model SS-2X electrostatic locator. The device was then brought to a radial distance of 2½ inch from the pipe. Whereever the locator had indicated the presence of a voltage of 7 kV or higher, a transition in one or more LCD elements of the device was observed.

I claim:

1. A method of detecting an electric field generated by an electrical component, comprising the steps of:
   (I) providing a device having at least one liquid crystal display element, said display element comprising:
      (a) a first conductor, at least part of which is transparent;
      (b) a second conductor aligned relative to said first conductor such that a portion of one of said conductors extends significantly beyond the other; and
      (c) a liquid crystal material optically responsive to an electric field and positioned between said first and second conductors;
   (II) bringing said device into the proximity of said electrical component, but without making electrical contact with either said component or with ground, such that said first and second conductors are positioned at different areas of intensity of said electric field; and
   (III) observing the optical state of said liquid crystal display element.

2. A method according claim 1 wherein said device comprises an array comprising a plurality of said liquid crystal display elements electrically insulated from each other.

3. A method according to claim 1 wherein said device comprises an array comprising a plurality of said liquid crystal display elements, some of which are electrically connected in series.

4. A method according to claim 1 wherein said device comprises an array comprising a plurality of said liquid crystal display elements, at least some of which share a common, continuous first or second conductor.

5. A method according to claim 1 wherein said device comprises an array comprising a plurality of said liquid crystal display elements, at least one of which has a substantially different capacitance from at least one other of said liquid crystal display elements.

6. A method according to claim 1 wherein said device comprises an array comprising a plurality of said liquid crystal display elements, a majority of which have substantially different capacitances from each other.

7. A method according to claim 1 wherein said device comprises an array comprising a plurality of said liquid crystal display elements having substantially the same capacitance.

8. A method according to claim 1 wherein said device has more than one liquid crystal display element sharing a common continuous body of encapsulated liquid crystal material.

9. A method according to claim 1 wherein at least part of each of said first and second conductors is transparent.

10. A method according to claim 1 wherein said first and second conductors are respectively supported by a first and a second support material, which support materials are transparent in those portions thereof where the conductor being supported is also transparent.

11. A method according to claim 1, wherein said first and second conductors independently comprise a material selected from the group consisting of gold, nickel, chromium, titanium oxide, tin oxide, indium oxide, aluminum, antimony tin oxide, and indium tin oxide.

12. A method according to claim 1, wherein each of said first and second conductors comprise indium tin oxide.

13. A method according to claim 1, wherein said electrical component carries a static electrical charge.

14. A method according to claim 1, wherein said electrical component carries a high voltage.

15. A method according to claim 1, wherein said liquid crystal material is encapsulated.

16. A method according to claim 15, wherein said encapsulated liquid crystal material is nematic.

17. A method according to claim 15, wherein said encapsulated liquid crystal material is smectic.

18. A device for detecting an electric field surrounding an electrical component, said device comprising:
   (I) an array comprising a plurality of liquid crystal display elements each of which comprises
      (a) a first conductor, at least part of which is transparent;
      (b) a second conductor aligned relative to said first conductor such that a portion of one of said conductors extends significantly beyond the other; and
      (c) a liquid crystal material optically responsive to an electric field and positioned between said first and second conductors; and
   (II) a protective packaging surrounding and electrically insulating said array from the exterior environment, said protective packaging being at least partially transparent to permit viewing of the optical state of at least one of said liquid crystal display elements.

19. A device according to claim 18 having a laminar construction, wherein said protective packaging comprises a first and a second sheet of transparent support material sealed to each other.

20. A device according to claim 18 wherein said liquid crystal display elements are electrically insulated from each other.

21. A device according to claim 18 wherein at least some of said liquid crystal display elements share a common, continuous first or second conductor.

22. A device according to claim 18 wherein at least some of said liquid crystal display elements are electrically connected in series.

23. A device according to claim 18 wherein each of said liquid crystal display elements has substantially the same capacitance.

24. A device according to claim 18 wherein at least one of said liquid crystal display elements has a substantially different capacitance from at least one other of said liquid crystal display elements.

25. A device according to claim 18 wherein a majority of said liquid crystal display elements have substantially different capacitances from each other.

26. A device according to claim 18, wherein said first and second conductors independently comprise a material selected from the group consisting of gold, nickel, chromium, titanium oxide, tin oxide, indium oxide, aluminum, antimony tin oxide, and indium tin oxide.

27. A device according to claim 18, wherein each of said first and second conductors comprise indium tin oxide.

28. A device according to claim 18 wherein said liquid crystal display elements share a common body of encapsulated liquid crystal material.

29. A device according to claim 18, wherein said liquid crystal material is encapsulated.

30. A device according to claim 29, wherein said liquid crystal material is nematic.

31. A device according to claim 29, wherein said liquid crystal material is smectic.

32. A device according to claim 18, further comprising an insulating means for attaching said device to said component in the region where said electric field is to be detected.

33. A device according to claim 18, further comprising an insulating means for positioning said device in the region where said electric field is to be detected.

34. A liquid crystal device for detecting an electric field surrounding an electrical component, said device having a laminar structure comprising
a first and a second transparent supporting sheet;
a first and a second transparent conductor, respectively deposited on the inside surfaces of said first and second sheets; and
encapsulated liquid crystal material optically responsive to an electric field, sandwiched between said first and second sheets and in contact with said first and second transparent conductors;
said first and second transparent conductors being aligned such that said first conductor partially overlaps said second conductor, and vice-versa; and
said first and second sheets being sealed to each other along the edges thereof, to form a protective package sealing off and electrically insulating said conductors and liquid crystal material from the exterior environment.

35. A method of estimating the magnitude of the potential of an electrical component from the intensity of the electric field generated by said component, comprising the steps of:
(I) providing a device having an array of liquid crystal display elements, each of said display elements comprising:
  (a) a first conductor, at least part of which is transparent;
  (b) a second conductor aligned relative to said first conductor such that a portion of one of said first and second conductors extends significantly beyond the other conductor; and
  (c) a liquid crystal material optically responsive to an electric field and positioned between said first and second conductors;
  said device having been calibrated as to which liquid crystal display elements change their optical state at a specified distance from a potential source with a known potential;
(II) bringing said device to the specified distance in the proximity of said electrical component, but without making electrical contact with either said component or with ground;
(III) observing which liquid crystal display elements have changed their state; and
(IV) estimating the voltage of said component by reference to said calibration.

* * * * *